United States Patent
Lu et al.

(10) Patent No.: US 9,412,661 B2
(45) Date of Patent: Aug. 9, 2016

(54) METHOD FOR FORMING PACKAGE-ON-PACKAGE STRUCTURE

(71) Applicant: Taiwan Semiconductor Manufacturing Company, Ltd., Hsin-Chu (TW)

(72) Inventors: Chun-Lin Lu, Hsin-Chu (TW);
Ming-Kai Liu, New Taipei (TW);
Kai-Chiang Wu, Hsin-Chu (TW);
Ching-Feng Yang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/683,502

(22) Filed: Nov. 21, 2012

(65) Prior Publication Data

US 2014/0138816 A1   May 22, 2014

(51) Int. Cl.

| H01L 23/48 | (2006.01) |
| H01L 21/768 | (2006.01) |
| H01L 21/56 | (2006.01) |
| H01L 23/00 | (2006.01) |
| H01L 25/03 | (2006.01) |
| H01L 25/00 | (2006.01) |
| H01L 23/538 | (2006.01) |
| H01L 21/683 | (2006.01) |
| H01L 23/31 | (2006.01) |
| H01L 23/498 | (2006.01) |

(52) U.S. Cl.
CPC ........ *H01L 21/76898* (2013.01); *H01L 21/561* (2013.01); *H01L 21/6835* (2013.01); *H01L 21/6836* (2013.01); *H01L 23/49827* (2013.01); *H01L 23/49833* (2013.01); *H01L 23/5385* (2013.01); *H01L 24/94* (2013.01); *H01L 24/97* (2013.01); *H01L 25/03* (2013.01); *H01L 25/50* (2013.01); *H01L 23/3128* (2013.01); *H01L 23/49816* (2013.01); *H01L 24/73* (2013.01); *H01L 2221/6834* (2013.01); *H01L 2221/68327* (2013.01); *H01L 2221/68331* (2013.01); *H01L 2221/68381* (2013.01); *H01L 2224/0401* (2013.01); *H01L 2224/04042* (2013.01); *H01L 2224/0557* (2013.01); *H01L 2224/05572* (2013.01); *H01L 2224/06181* (2013.01); *H01L 2224/16145* (2013.01); *H01L 2224/1703* (2013.01); *H01L 2224/32145* (2013.01); *H01L 2224/32225* (2013.01); *H01L 2224/48227* (2013.01); *H01L 2224/73265* (2013.01); *H01L 2224/94* (2013.01); *H01L 2224/97* (2013.01); *H01L 2225/0651* (2013.01); *H01L 2225/06513* (2013.01); *H01L 2225/06541* (2013.01); *H01L 2225/06565* (2013.01); *H01L 2225/06568* (2013.01); *H01L 2924/00014* (2013.01); *H01L 2924/15311* (2013.01); *H01L 2924/15331* (2013.01); *H01L 2924/351* (2013.01)

(58) Field of Classification Search
CPC .............. H01L 21/561; H01L 21/6835; H01L 21/6836; H01L 21/76898
USPC ........... 257/737, E33.056, E23.001; 438/106, 438/113
See application file for complete search history.

(56) References Cited

U.S. PATENT DOCUMENTS

| 2006/0172457 A1* | 8/2006 | Huang ........................ 438/106 |
| 2010/0117226 A1* | 5/2010 | Yang et al. .................. 257/737 |
| 2010/0159643 A1* | 6/2010 | Takahashi et al. ........... 438/108 |
| 2011/0248404 A1* | 10/2011 | Chiu ................... H01L 21/6835 257/773 |
| 2011/0278707 A1* | 11/2011 | Chi et al. ...................... 257/676 |
| 2012/0104623 A1* | 5/2012 | Pagaila ................... H01L 23/13 257/774 |

* cited by examiner

Primary Examiner — Matthew Gordon
(74) Attorney, Agent, or Firm — Slater Matsil, LLP

(57) ABSTRACT

A method comprises attaching a semiconductor die on a first side of a wafer, attaching a first top package on the first side of the wafer and attaching a second top package on the first side of the wafer. The method further comprises depositing an encapsulation layer over the first side of the wafer, wherein the first top package and the second top package are embedded in the encapsulation layer, applying a thinning process to a second side of the wafer, sawing the wafer into a plurality of chip packages and attaching the chip package to a substrate.

12 Claims, 23 Drawing Sheets

# METHOD FOR FORMING PACKAGE-ON-PACKAGE STRUCTURE

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As the demand for miniaturization, higher speed and greater bandwidth, as well as lower power consumption and latency has grown recently, there has grown a need for smaller and more creative packaging techniques of semiconductor dies.

As semiconductor technologies further advance, package-on-package semiconductor devices have emerged as an effective alternative to further reduce the physical size of a semiconductor device. In a package on package semiconductor device, active circuits such as logic, memory, processor circuits and the like are fabricated on different wafers and packages. Two or more packages are installed on top of one another, i.e. stacked, with a standard interface to route signals between them. Much higher density can be achieved by employing package on package semiconductor devices. Furthermore, package on package semiconductor devices can achieve smaller form factors, cost-effectiveness, increased performance and lower power consumption.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 1 illustrates a cross sectional view of a wafer in accordance with various embodiments of the present disclosure;

FIG. 2 illustrates a plurality of semiconductor dies bonded on top of the wafer shown in FIG. 1 in accordance with various embodiments of the present disclosure;

FIG. 3 illustrates a cross sectional view of semiconductor device shown in FIG. 2 after a plurality of top packages are bonded on the wafer in accordance with various embodiments of the present disclosure;

FIG. 4 illustrates a cross sectional view of the semiconductor device shown in FIG. 3 after an encapsulation layer is formed over the wafer in accordance with various embodiments of the present disclosure;

FIG. 5 illustrates a cross sectional view of the semiconductor device shown in FIG. 4 after the semiconductor device is flipped and bonded on a carrier in accordance with various embodiments of the present disclosure;

FIG. 6 illustrates a cross sectional view of the semiconductor device shown in FIG. 5 after a thinning process is applied to the backside of the semiconductor device in accordance with various embodiments of the present disclosure;

FIG. 7 illustrates a cross sectional view of the semiconductor device shown in FIG. 6 after a redistribution layer is formed over the backside of the semiconductor device in accordance with various embodiments of the present disclosure;

FIG. 8 illustrates a cross sectional view of the semiconductor device shown in FIG. 7 after a dicing tape is attached to the backside of the semiconductor device in accordance with various embodiments of the present disclosure;

FIG. 9 illustrates a cross sectional view of the semiconductor device shown in FIG. 8 after the carrier is detached from the semiconductor device in accordance with various embodiments of the present disclosure;

FIG. 10 illustrates a process of separating the wafer into individual chip packages using a dicing process;

FIG. 11 illustrates a cross sectional view of the semiconductor device shown in FIG. 10 after a plurality of UBM structures and interconnection pads are formed in accordance with various embodiments of the present disclosure;

FIG. 12 illustrates a cross sectional view of the semiconductor device shown in FIG. 11 after an individual chip package is mounted on a substrate in accordance with various embodiments of the present disclosure.

Corresponding numerals and symbols in the different figures generally refer to corresponding parts unless otherwise indicated. The figures are drawn to clearly illustrate the relevant aspects of the various embodiments and are not necessarily drawn to scale

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely a method for forming a package on package semiconductor device. The embodiments of the disclosure may also be applied, however, to a variety of semiconductor devices. Hereinafter, various embodiments will be explained in detail with reference to the accompanying drawings.

FIGS. 1-12 are cross sectional views of intermediate stages in the making of a package on package semiconductor device in accordance with various embodiments of the present disclosure.

Figure 1:
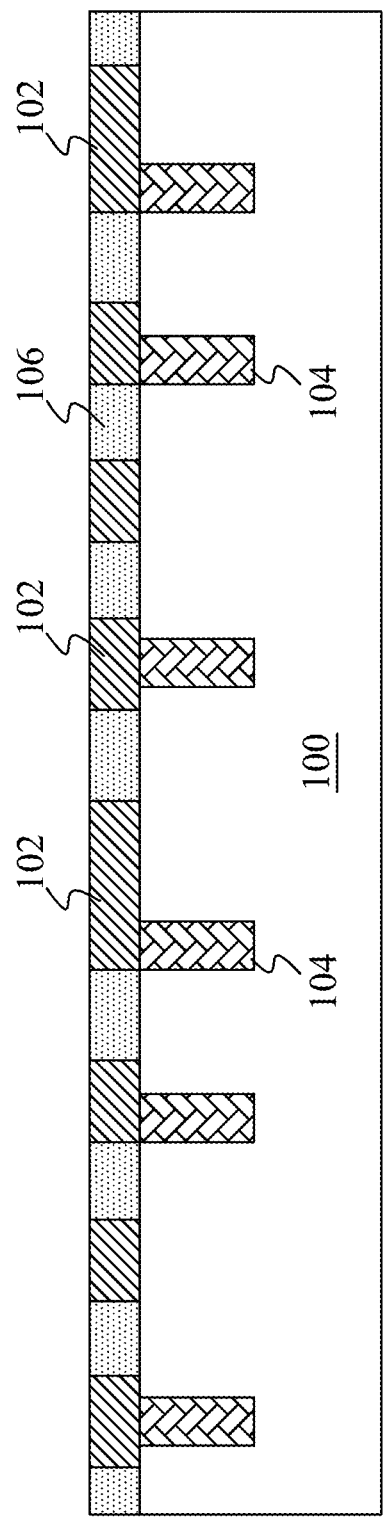
FIGS. 1-12 are cross sectional views of intermediate stages in the making of a package on package semiconductor device in accordance with an embodiment.

FIG. 1 illustrates a cross sectional view of a wafer in accordance with various embodiments of the present disclosure. The wafer 100 may be formed of silicon, although it may also be formed of other group III, group IV, and/or group V elements, such as silicon, germanium, gallium, arsenic, and combinations thereof. The wafer may comprise a bulk substrate or a silicon-on-insulator (SOI) substrate.

In some embodiments, the wafer 100 may be a standard wafer having a thickness more than 100 um. In alternative embodiments, the wafer 100 may be of a thickness of about 770 um. It should be noted that the wafer 100 is also known as an interposer.

The wafer 100 may comprise a plurality of integrated circuits (not shown), each of which may comprise various layers such as active circuit layers, substrate layers, inter-layer dielectric (ILD) layers and inter-metal dielectric (IMD) layers (not shown). The wafer 100 may further comprise a plurality of through vias. In some embodiments, the through vias are through-substrate vias (TSVs) or through-silicon vias (TSVs), such as TSVs 104. The TSV 104 may be filled with a conductive material such as copper, tungsten and/or the like. The active circuit layers (not shown) of the wafer 100 may be coupled to external circuits (not shown) formed over the wafer 100 through the plurality of TSVs (e.g., TSV 104).

A dielectric layer 106 is formed over the wafer 100. The dielectric layer 106 may be alternatively referred to as an ILD layer 106 hereinafter. In some embodiments, the ILD layer 106 is formed of a photo-sensitive material such as polybenzoxazole (PBO), polyimide, benzocyclobutene (BCB), any combinations thereof and/or the like, which may be easily patterned using a lithography mask. In alternative embodiments, the ILD layer 106 may be formed of a nitride such as silicon nitride, an oxide such as silicon oxide, phosphosilicate glass (PSG), borosilicate glass (BSG), boron-doped phosphosilicate glass (BPSG), any combinations thereof and/or the like. The ILD layer 106 may be formed by suitable fabrication techniques such as such as spinning, CVD, and PECVD and/or the like.

As shown in FIG. 1, the redistribution layer 102 is formed over the top surface of the wafer 100. More particularly, the redistribution layer 102 provides a conductive path between TSVs (e.g., TSV 104) and the metal bumps subsequently formed over the wafer 100. The redistribution layer 102 may be formed of metal materials such as aluminum, aluminum alloys, copper or copper alloys and the like. The ILD layer 106 may have a plurality of openings, through which top surfaces of the redistribution layer 102 are exposed. The exposed portions of the redistribution layer 102 may function as bond pads.

Figure 2:
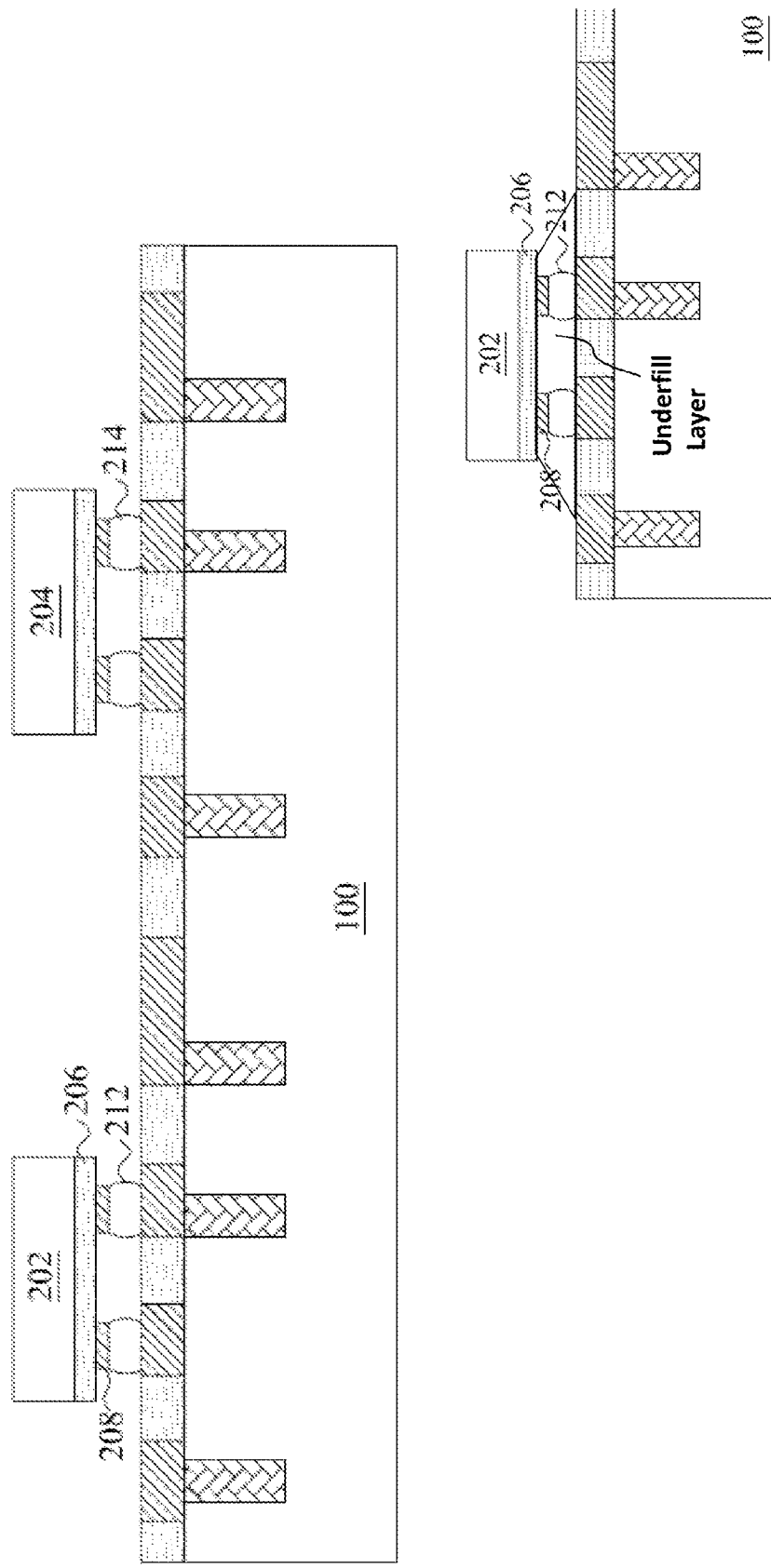

FIG. 2 illustrates a plurality of semiconductor dies bonded on top of the wafer shown in FIG. 1 in accordance with various embodiments of the present disclosure. A plurality of semiconductor dies (e.g., semiconductor dies 202 and 204) are picked and placed on top of the wafer 100. After a reflow process, the semiconductor dies such as 202 and 204 are bonded on the wafer 100 through the bumps 212 and 214, which are coupled between the wafer 100 and the semiconductor dies 202 and 204. In some embodiments, the bonding process may be a bump on trace (BOT) process. The detailed processes of bonding semiconductor dies on a wafer are well known in the art, and hence are not discussed herein. It should be noted that while FIG. 2 illustrates two semiconductor dies bonded on the wafer 100, the wafer 100 may accommodate any number of semiconductor dies.

As shown in FIG. 2, semiconductor dies 202 and 204 have a substantially identical structure. For simplicity, only the structure of the semiconductor die 202 is described in detail below. In order to give a basic insight of the inventive aspects of various embodiments, the semiconductor dies 202 and 204 are drawn without details. However, it should be noted that the semiconductor dies 202 and 204 may comprise basic semiconductor layers such as active circuit layers, substrate layers, ILD layers and IMD layers (not shown respectively).

The semiconductor die 202 may comprise a substrate (not shown). The substrate may be a silicon substrate. Alternatively, the substrate may be a silicon-on-insulator substrate. The substrate may further comprise a variety of electrical circuits (not shown). The electrical circuits formed on the substrate may be any type of circuitry suitable for a particular application.

In some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

An isolation layer 206 is formed on the substrate. The isolation layer 206 may be formed, for example, of a dielectric material, such as silicon oxide. The isolation layer 206 may be formed by any suitable method known in the art, such as spinning, chemical vapor deposition (CVD) and plasma enhanced chemical vapor deposition (PECVD). It should also be noted that one skilled in the art will recognize that the isolation layer 206 may further comprise a plurality of dielectric layers.

A redistribution layer 208 is formed on the isolation layer 206. The active circuit layer (not shown) of the semiconductor die 202 may be bridged by the redistribution layer 208 so that the active circuit layer of the semiconductor die 202 can be coupled to the input and output (I/O) terminals of the semiconductor die 202. A plurality of under bump metal (UBM) structures (not shown) may be formed on the redistribution layer 208. The UBM structures may help to prevent diffusion between the bumps (e.g., bumps 212) and the integrated circuits of the semiconductor die 202, while providing a low resistance electrical connection.

The bumps (e.g., bumps 212) provide an effective way to connect the semiconductor die 202 with the wafer 100. The bumps are I/O terminals of the semiconductor die 202. In some embodiments, the bumps (e.g., bumps 212) may be a plurality of solder balls. Alternatively, the bumps (e.g., bumps 212) may be a plurality of land grid array (LGA) pads.

After the semiconductor dies (e.g., semiconductor die 202) are bonded on the wafer 100, an underfill material layer (not shown) may be formed in the gap between the wafer 100 and the plurality of semiconductor dies (e.g., the semiconductor die 202) mounted on top of the wafer 100. In some embodiments, the underfill material layer may be an epoxy, which is dispensed at the gap between the wafer 100 and the semiconductor dies 202 and 204. The epoxy may be applied in a liquid form, and may harden after a curing process. In alternative embodiments, the underfill layer may be formed of curable materials such as polymer based materials, resin based materials, polyimide, epoxy and any combinations of thereof.

The underfill layer can be formed by any suitable dispense techniques. Alternatively, the underfill layer may be formed by a spin-on coating process, dry film lamination process and/or the like. An advantageous feature of having an underfill material layer is that the underfill material layer helps to prevent the bumps 212 and 214 from cracking. In addition, the underfill material layer may help to reduce the mechanical and thermal stresses on the semiconductor dies 202 and 204 during the fabrication process.

Figure 3:
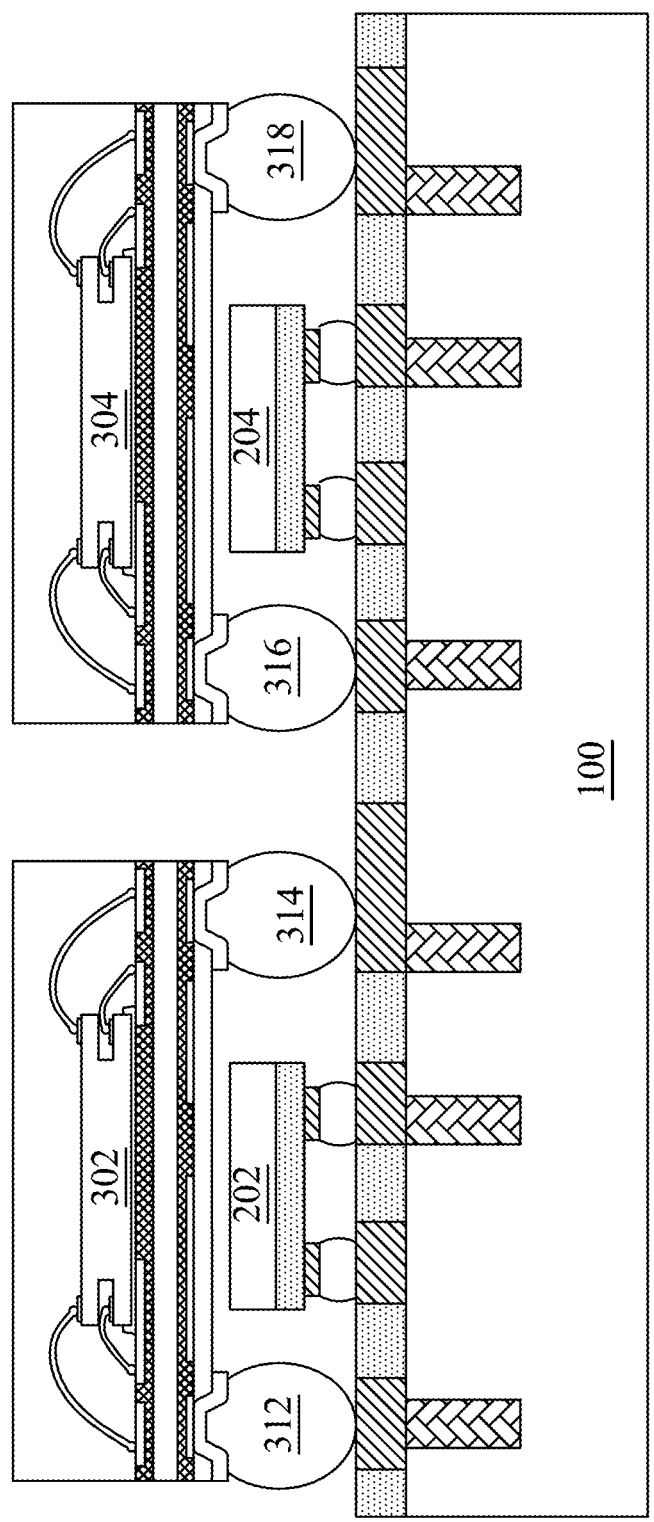

FIG. 3 illustrates a cross sectional view of semiconductor device shown in FIG. 2 after a plurality of top packages are bonded on the wafer in accordance with various embodiments of the present disclosure. The top packages 302 and 304 may comprise a plurality of stacked dies, which may be wire bonded to the input and output terminals of the top packages 302 and 304. The stacked dies of the top packages 302 and 304 may comprise memory dies, logic dies, processor dies and/or the like.

It should be noted the while FIG. 3 illustrates three stacked dies in each top package, this is merely an example. Likewise, the use of wire bonding is merely illustrative and other approaches for electrically connecting the stacked dies are within the contemplated scope of the present disclosure.

Figure 4:
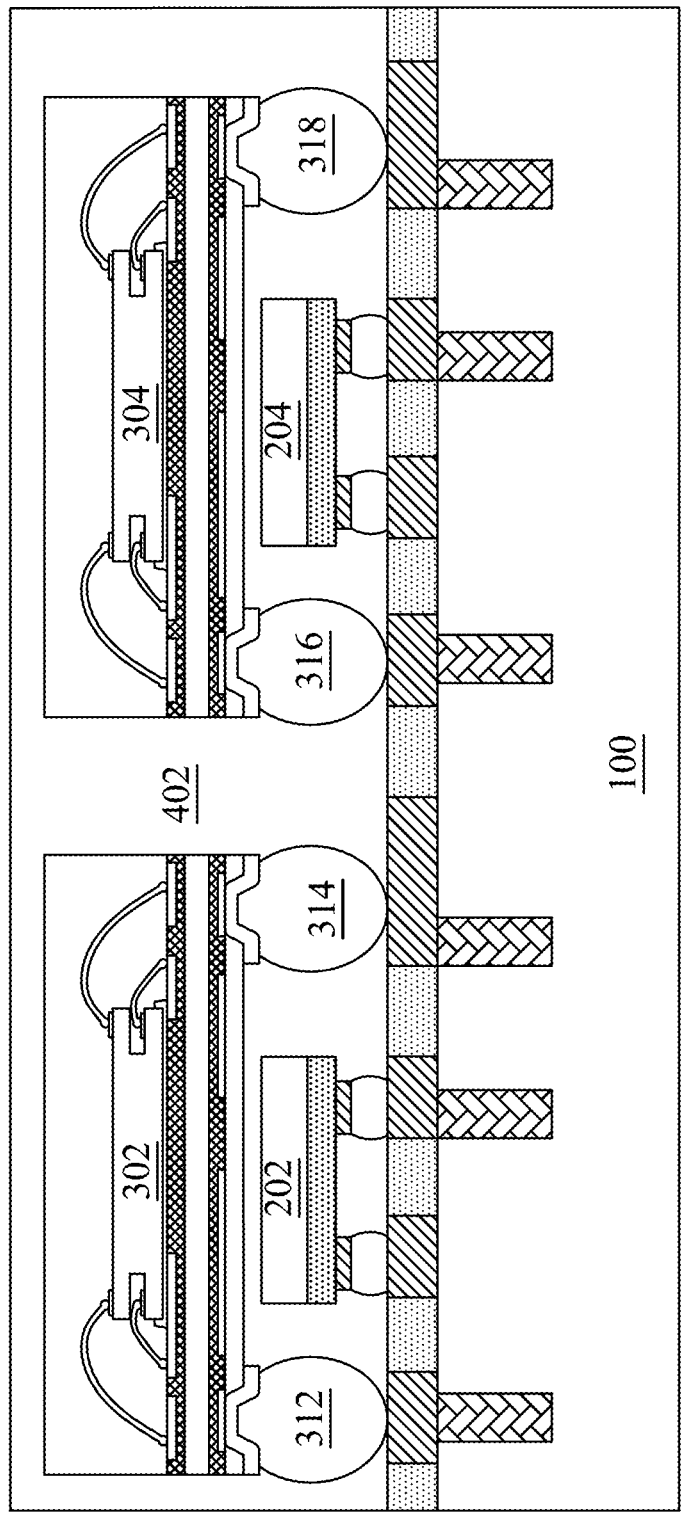

FIG. 4 illustrates a cross sectional view of the semiconductor device shown in FIG. 3 after an encapsulation layer is formed over the wafer in accordance with various embodiments of the present disclosure. In some embodiments, the encapsulation layer 402 may be an underfill layer. Throughout the description, the encapsulation layer 402 may be alternatively referred to as an underfill layer 402.

The underfill material layer 402 may fill the gap between the wafer 100 and the plurality of top packages (e.g., the top package 302) mounted on top of the wafer 100. In some embodiments, the underfill material layer 402 may be an epoxy, which is dispensed at the gap between the wafer 100 and the top packages (e.g., the top package 302). The epoxy may be applied in a liquid form, and may harden after a curing process.

In alternative embodiments, the underfill material layer 402 may be formed of curable materials such as polymer based materials, resin based materials, polyimide, epoxy and any combinations of thereof. The underfill material layer 402 can be formed by any suitable dispense techniques.

Figure 5:
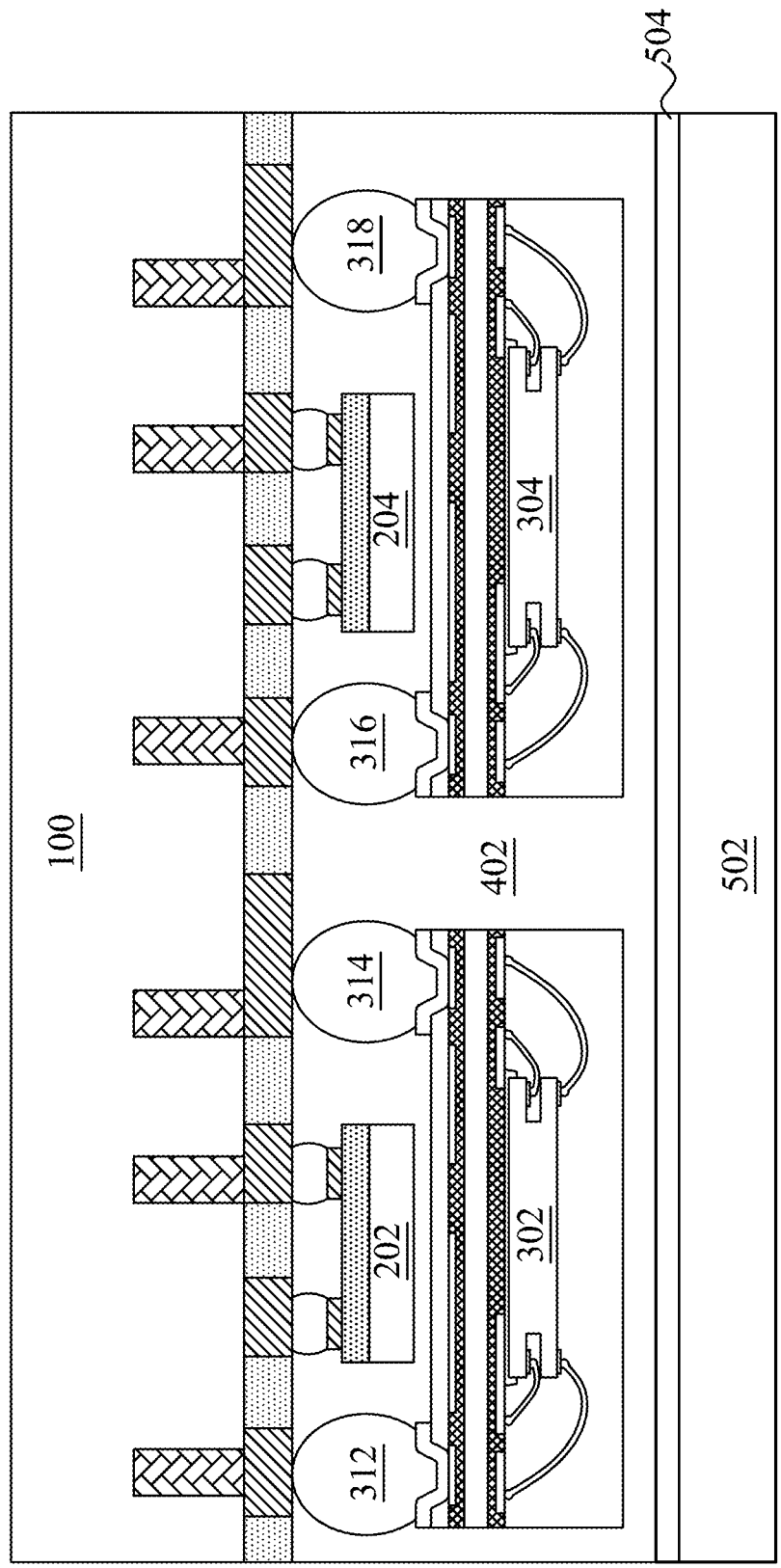

FIG. 5 illustrates a cross sectional view of the semiconductor device shown in FIG. 4 after the semiconductor device is flipped and bonded on a carrier in accordance with various embodiments of the present disclosure. The semiconductor device is flipped and the encapsulation layer side of the semiconductor device is mounted on a carrier 502. The carrier 502 may be formed of silicon, glass, ceramic aluminum oxide, silicon oxide, a combination thereof, and/or the like.

A release layer 504 is formed over the carrier 502. In some embodiments, the release layer 504 is formed of an epoxy-based thermal-release material. In alternative embodiments, the release layer 504 may be formed of an ultra-violet (UV) glue, which loses its adhesive property when exposed to UV lights.

The release layer 504 may be formed over the carrier 502 by any suitable semiconductor fabrication techniques. In some embodiments, the release layer 504 may be dispensed as a liquid and cured subsequently. In alternative embodiments, release layer 504 may be laminated onto carrier 502.

Figure 6:
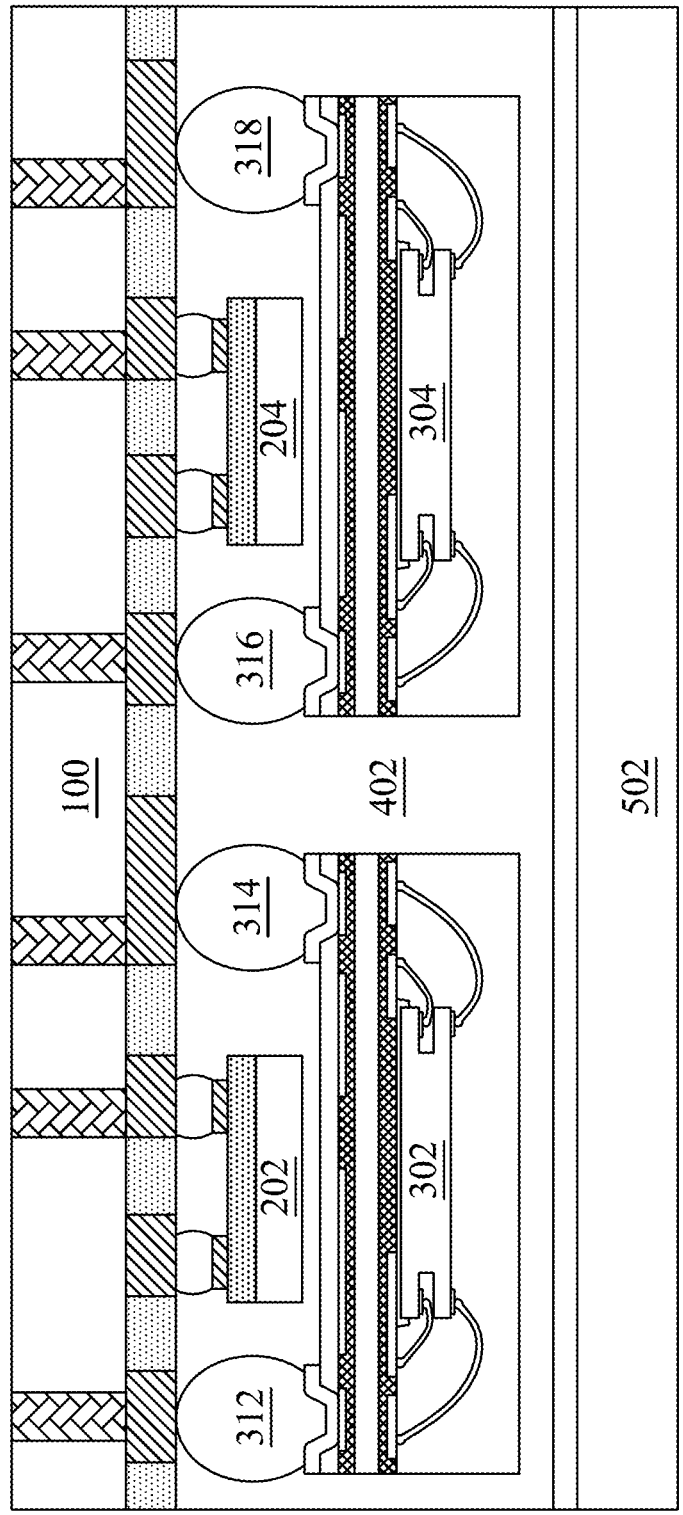

FIG. 6 illustrates a cross sectional view of the semiconductor device shown in FIG. 5 after a thinning process is applied to the backside of the semiconductor device in accordance with various embodiments of the present disclosure. The thinning process can employ a mechanical grinding process, a chemical polishing process, an etching process and/or the like.

By employing the thinning process, the backside of the wafer 100 can be ground so that the wafer 100 may have a thickness of approximately sub-100 um. In some embodiments, the thickness of the wafer 100 may be reduced to a range from about 20 um to about 50 um. It should be noted that by grinding the wafer 100 to a thickness as low as 20 um, such a thin wafer may enable small via feature size such as via diameter and depth. An advantageous feature of forming small TSVs is that the performance and power consumption of the semiconductor device can be further improved. Alternatively, the thickness of the wafer 100 may be ground until the embedded ends of the TSVs become exposed.

Figure 7:
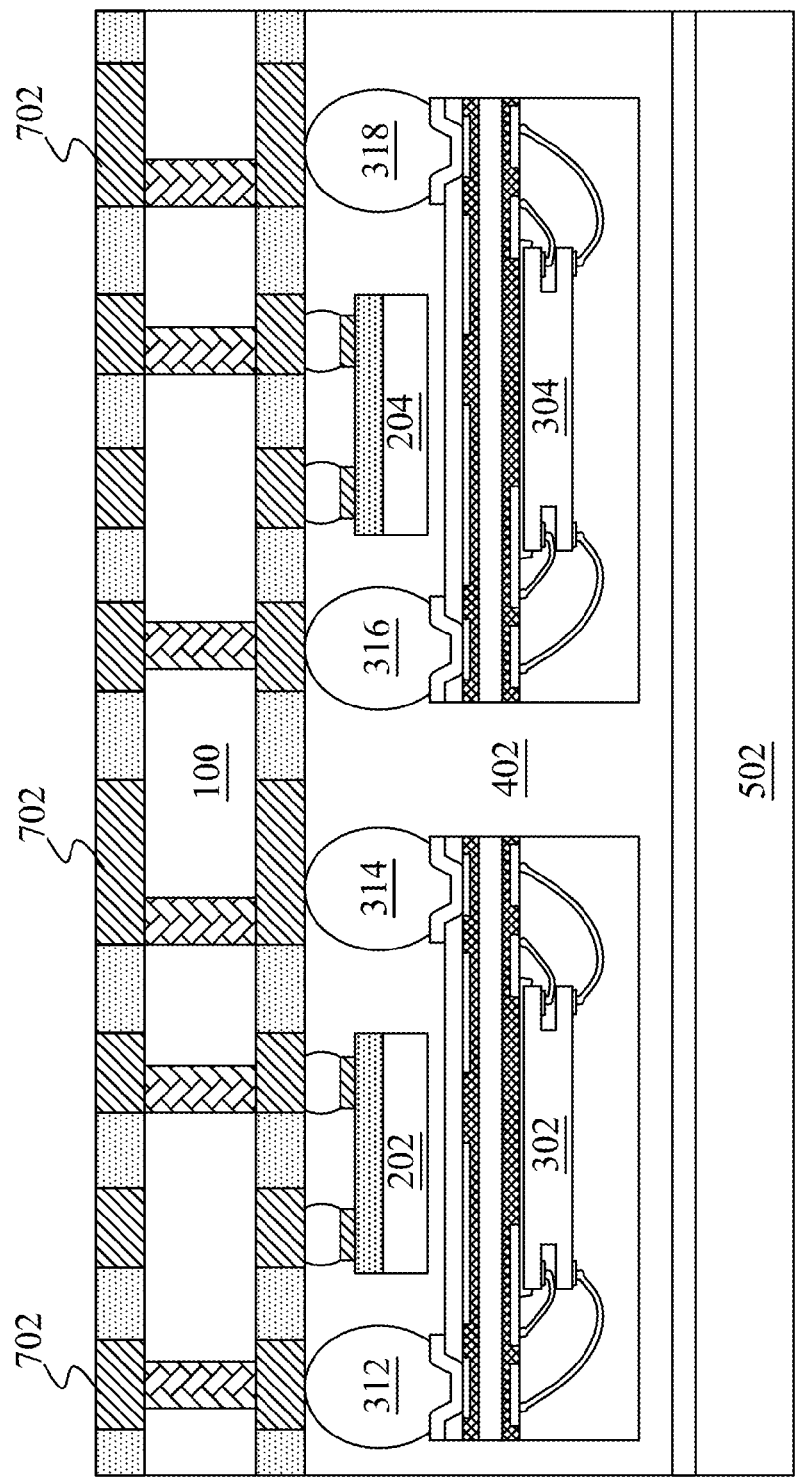

FIG. 7 illustrates a cross sectional view of the semiconductor device shown in FIG. 6 after a redistribution layer is formed over the backside of the semiconductor device in accordance with various embodiments of the present disclosure. The material and the formation method of the redistribution layer 702 may be similar to that of the redistribution layer 102 shown in FIG. 1, and therefore, explicit description of the formation of the redistribution layer 702 is omitted for brevity.

Figure 8:
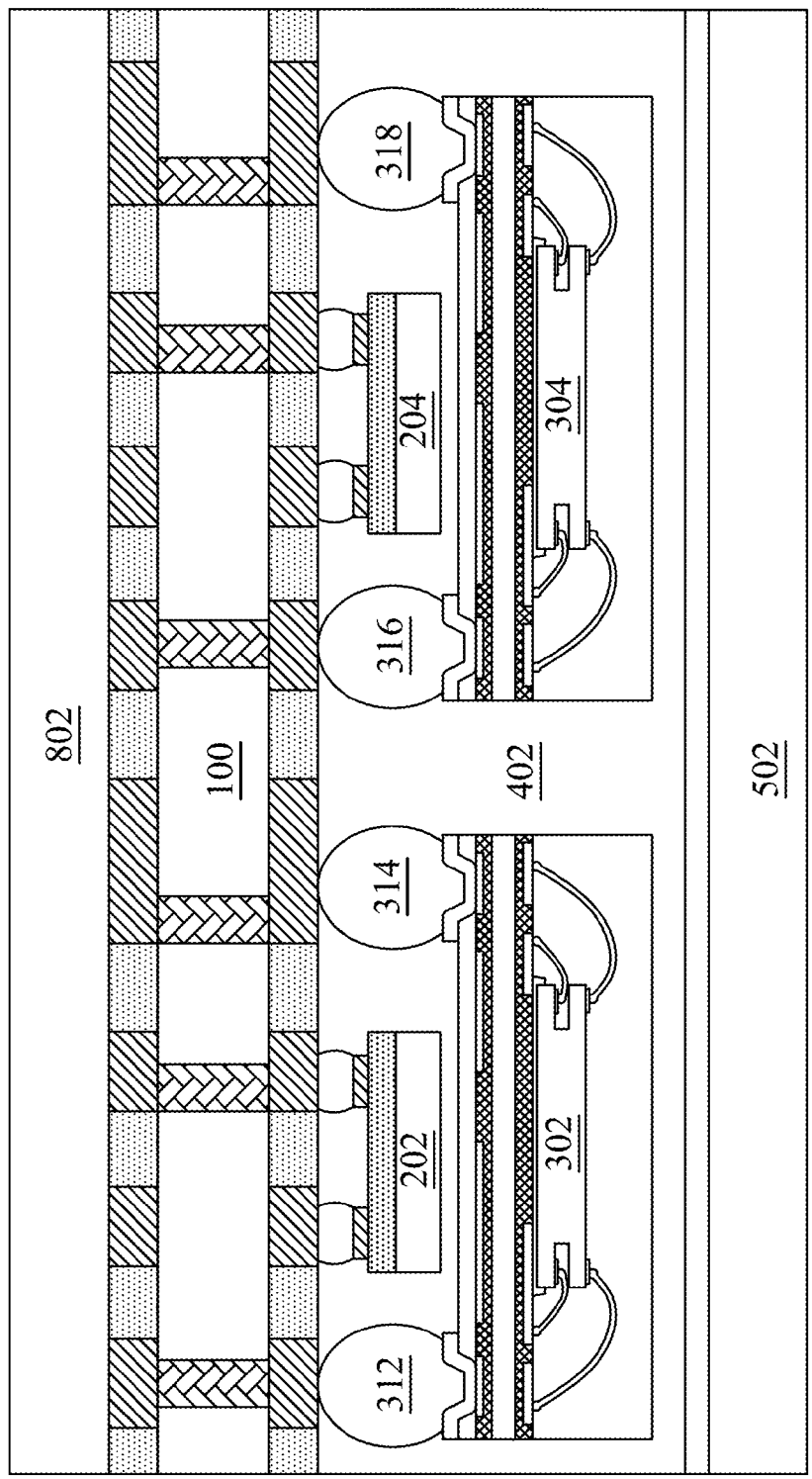

FIG. 8 illustrates a cross sectional view of the semiconductor device shown in FIG. 7 after a dicing tape is attached to the backside of the semiconductor device in accordance with various embodiments of the present disclosure. This dicing tape 802 may be formed of an adhesive. In alternative embodiments, the dicing tape 802 may be UV erasable. In other words, the dicing tape 802 may lose strength on exposure to UV.

Figure 9:
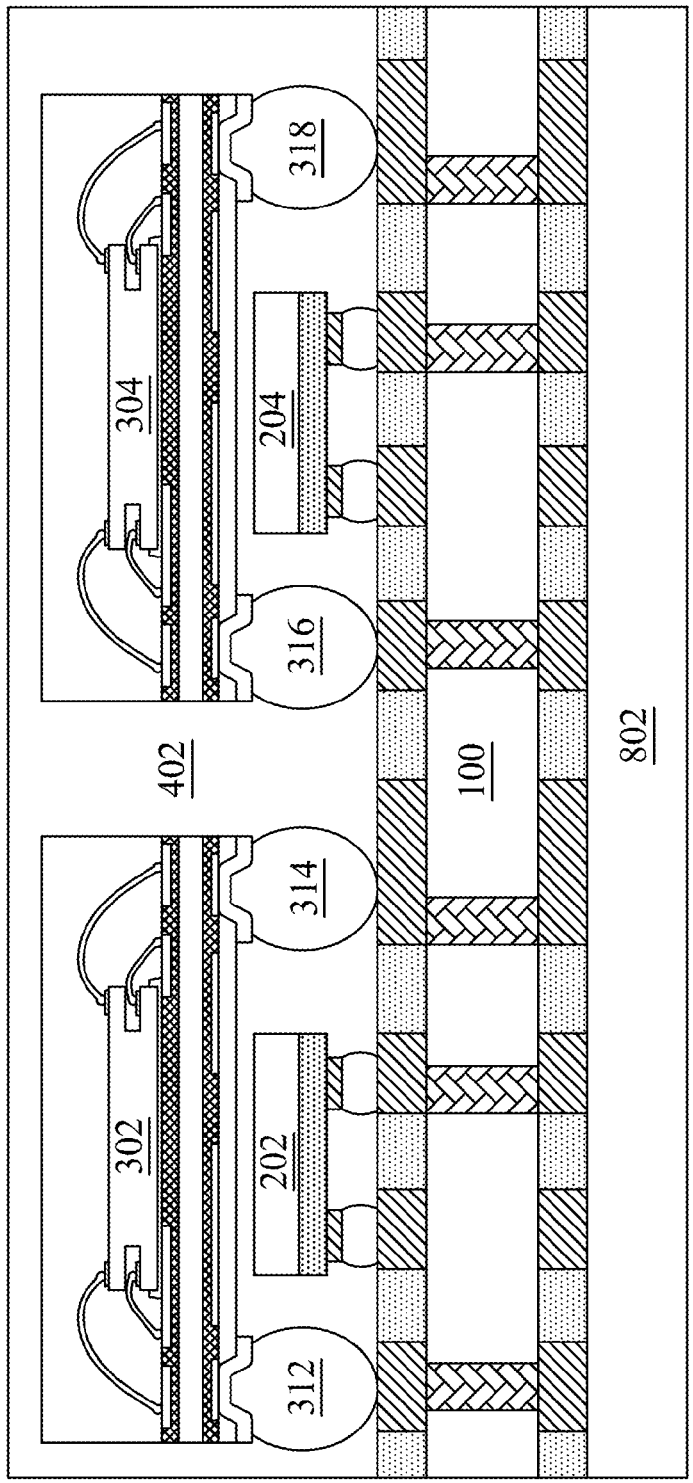

FIG. 9 illustrates a cross sectional view of the semiconductor device shown in FIG. 8 after the carrier is detached from the semiconductor device in accordance with various embodiments of the present disclosure. A variety of detaching processes may be employed to separate the semiconductor device from the carrier. The variety of detaching processes may comprise a chemical solvent, a UV exposure and the like.

Figure 10:
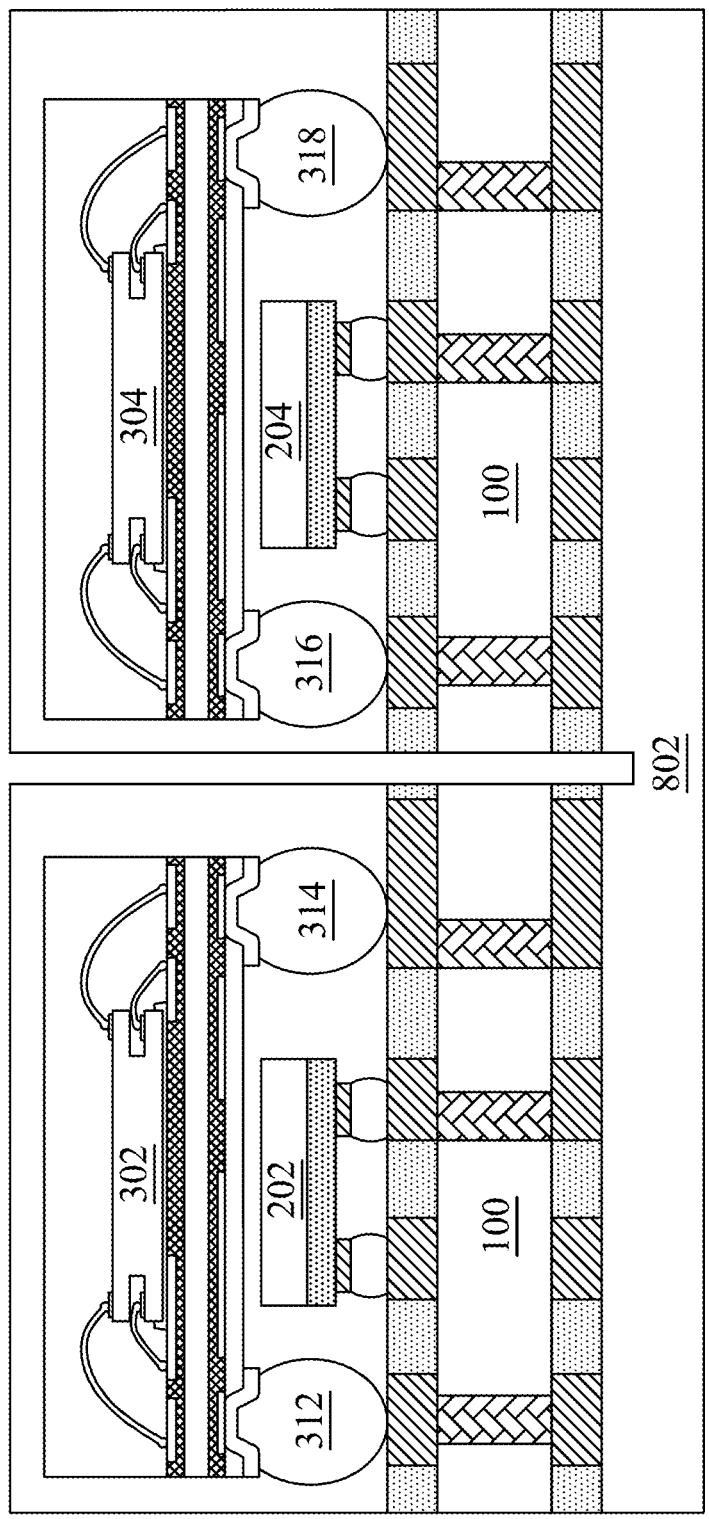

FIG. 10 illustrates a process of separating the wafer into individual chip packages using a dicing process. The dicing process is well known in the art, and hence is not discussed in detail herein.

Figure 11:
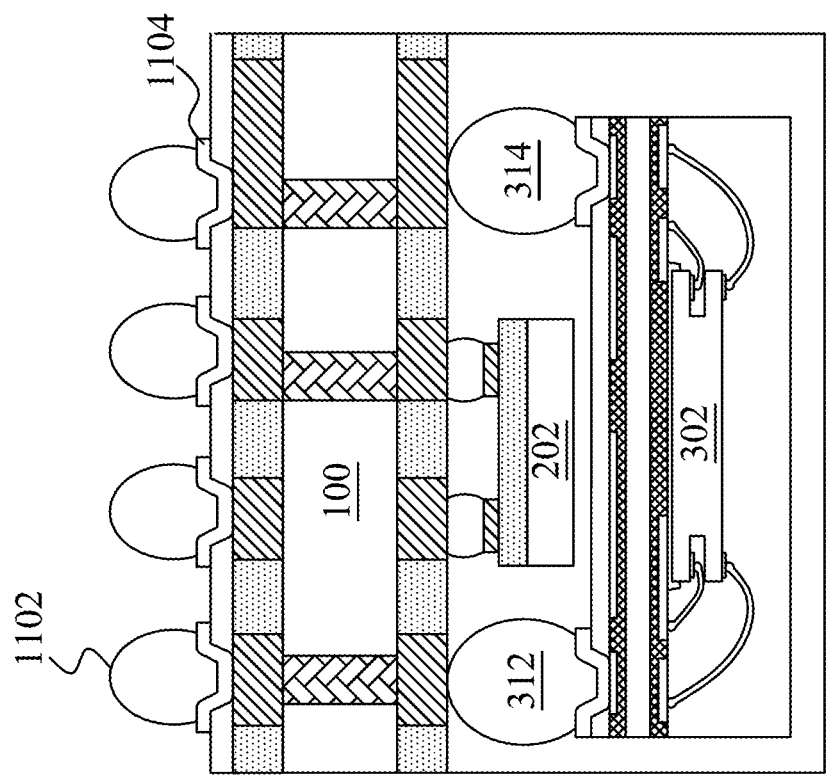

FIG. 11 illustrates a cross sectional view of the semiconductor device shown in FIG. 10 after a plurality of UBM structures and interconnection pads are formed in accordance with various embodiments of the present disclosure. The plurality of UBM structures 1104 are formed over the redistribution layer. The UBM structures 1104 help to prevent diffusion between the solder balls and the integrated circuits of the semiconductor device, while providing a low resistance electrical connection.

The interconnection pads are I/O pads of the semiconductor device. In accordance with an embodiment, the interconnection pads may be a plurality of solder balls 1102. In some embodiments, the solder balls 1102 may comprise SAC405. SAC405 comprises 95.5% Sn, 4.0% Ag and 0.5% Cu. Alternatively, the interconnection pads may be a plurality of land grid array (LGA) pads.

Figure 12:
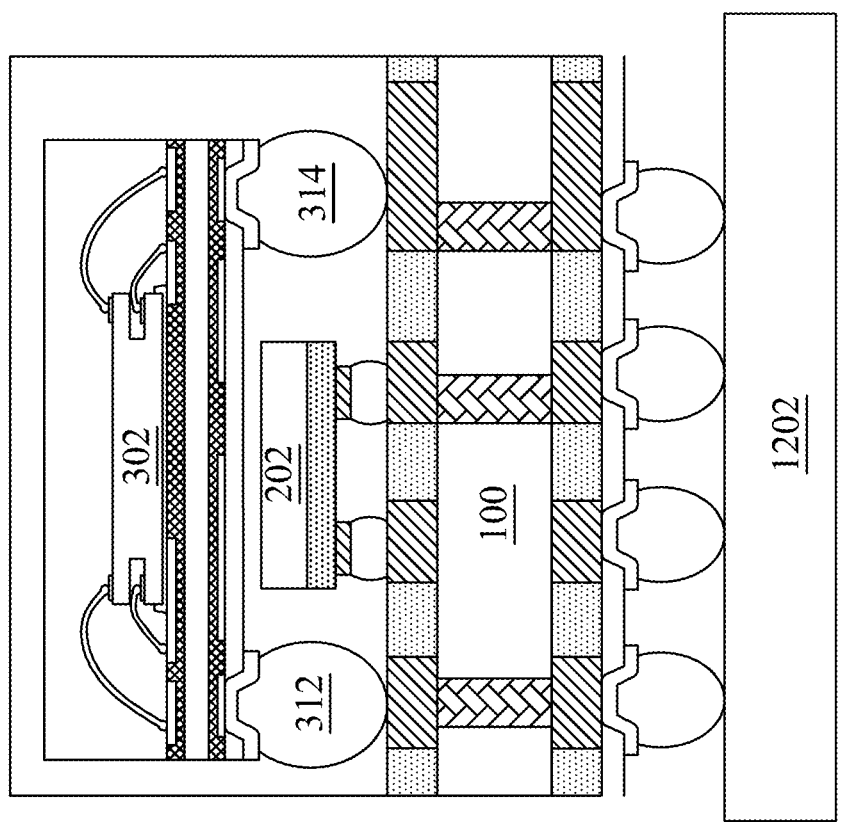
Figure 13:
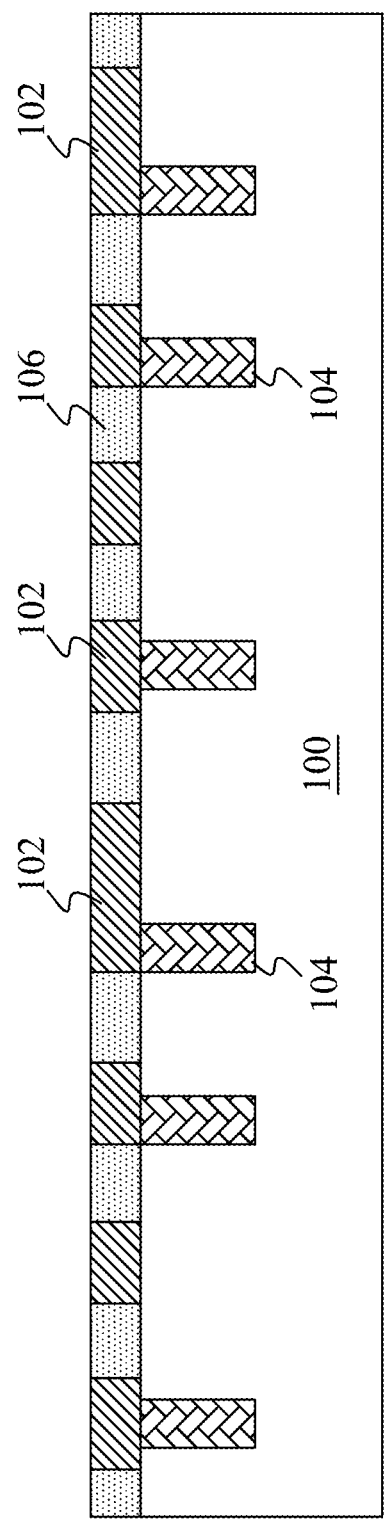
FIGS. 13-23 are cross sectional views of intermediate stages in the making of a package on package semiconductor device in accordance with another embodiment.
Figure 14:
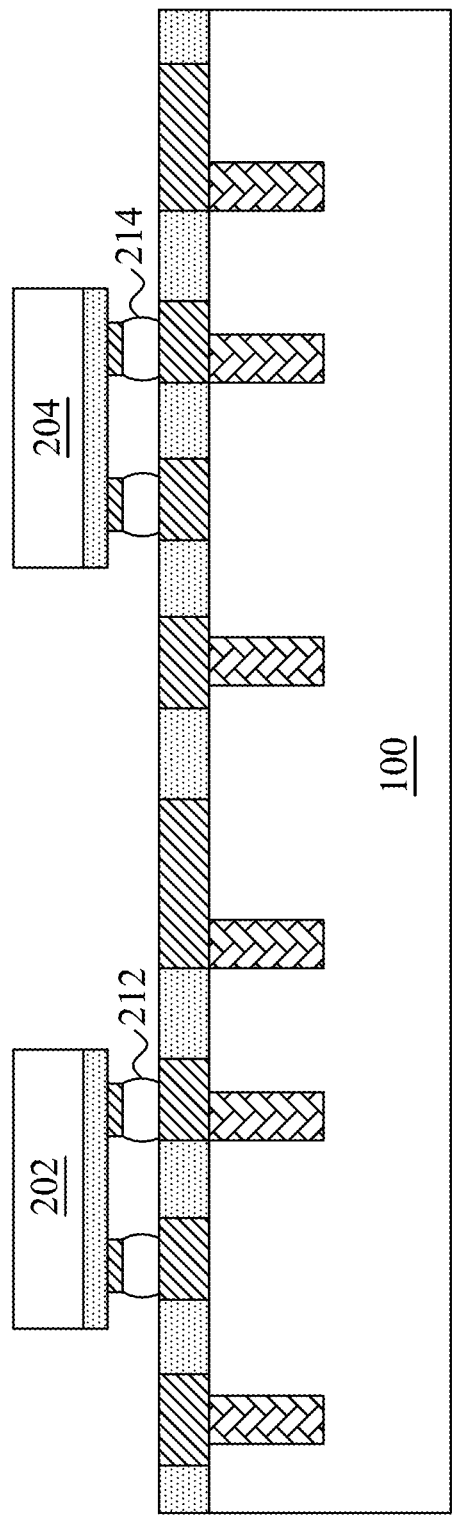
Figure 15:
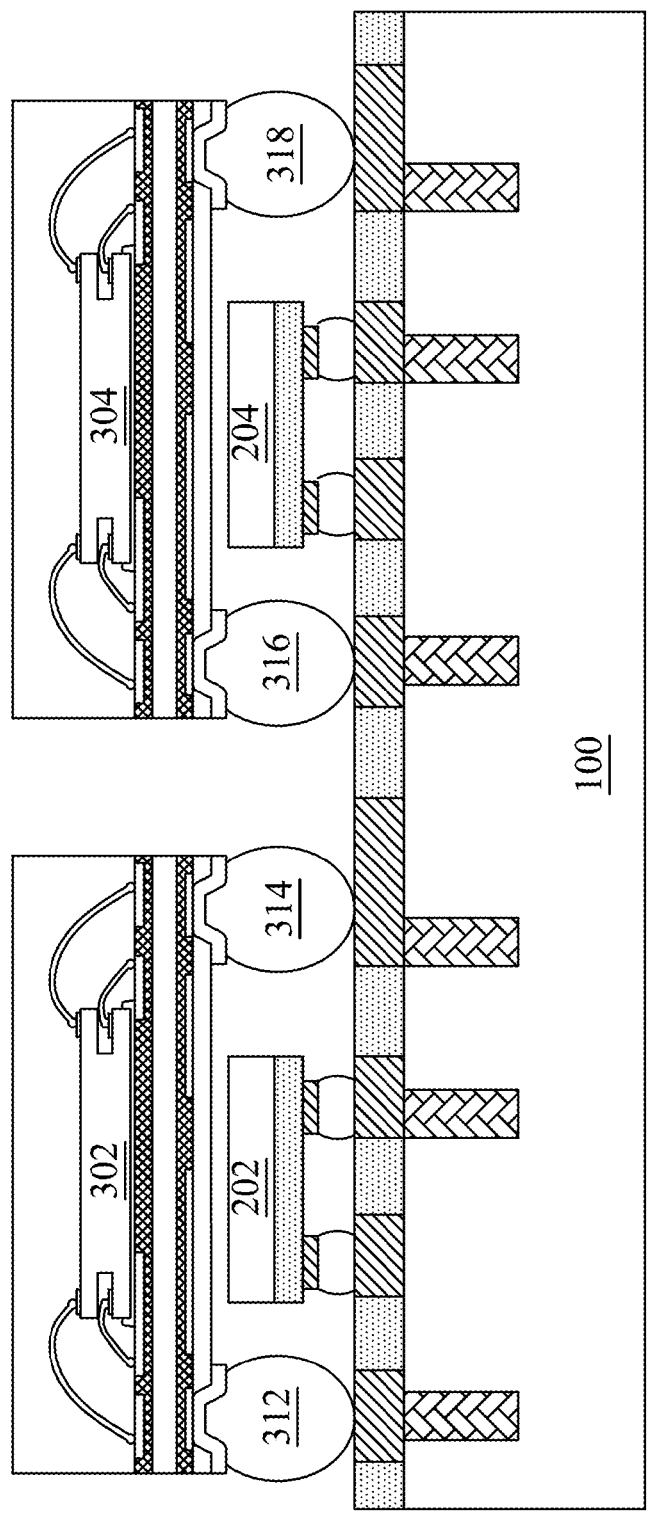
Figure 16:
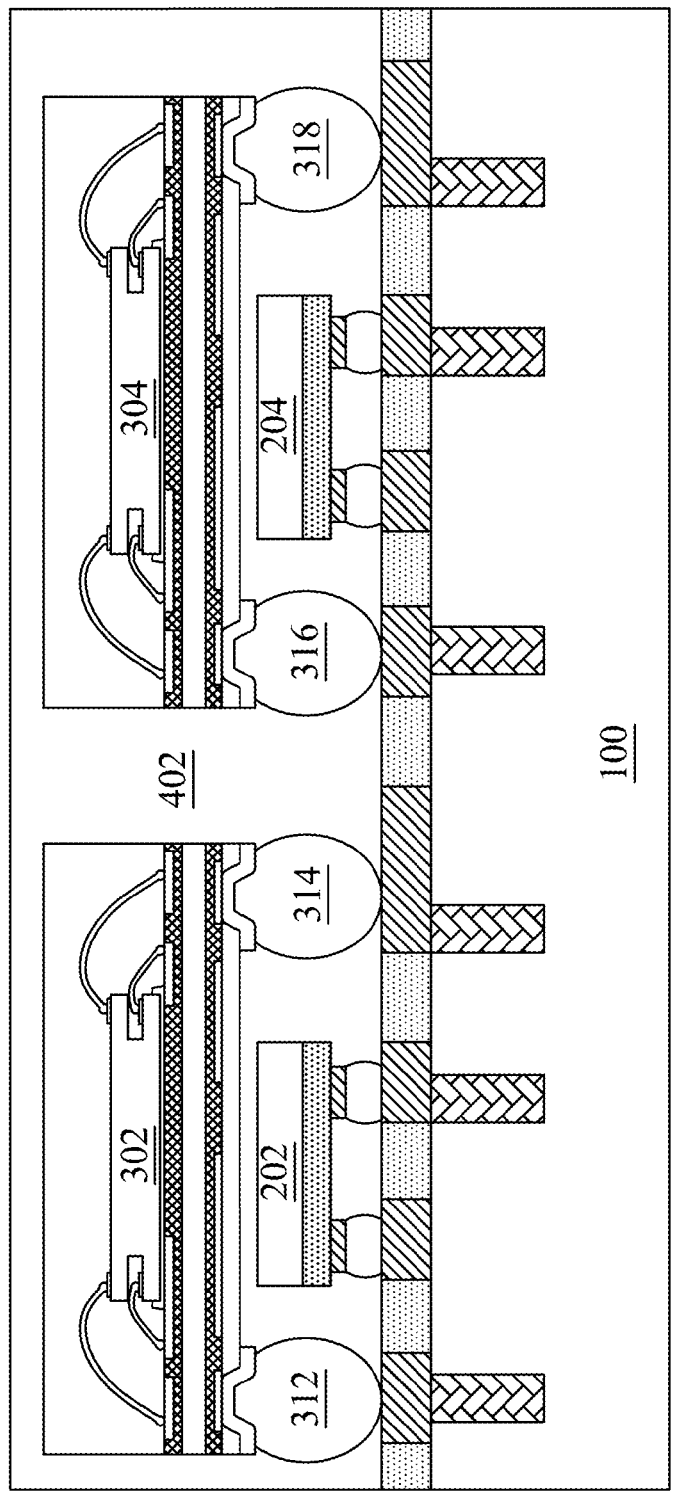
Figure 17:
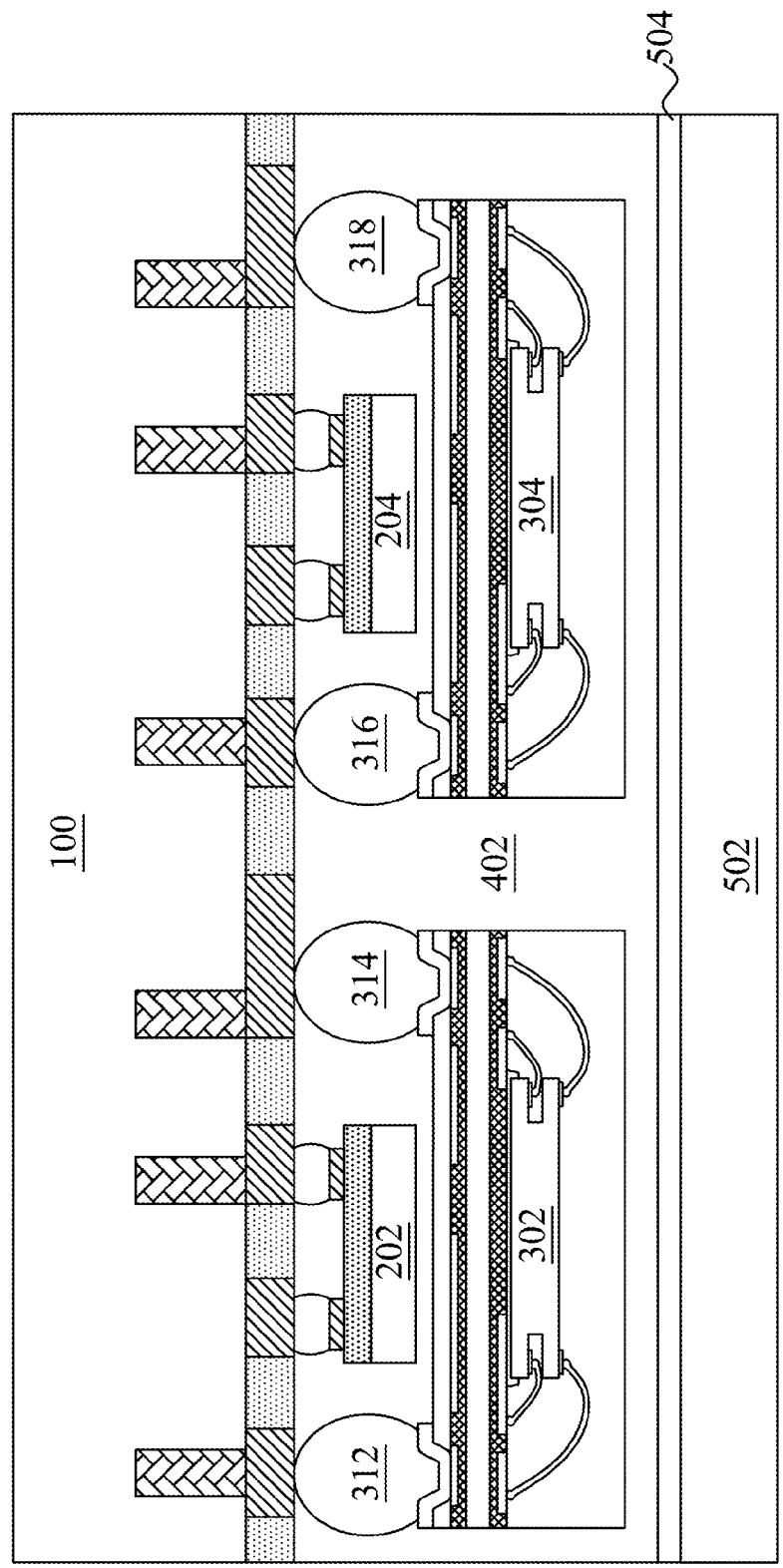
Figure 18:
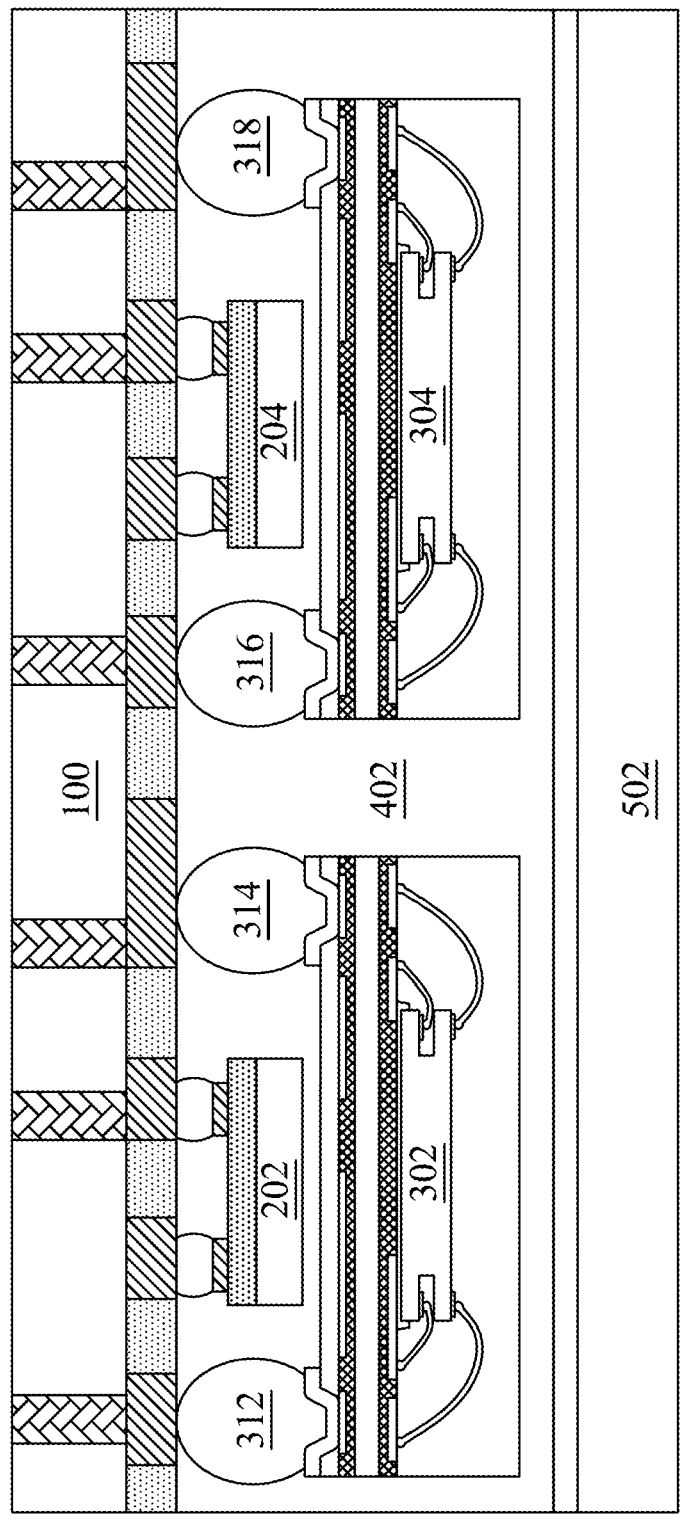
Figure 19:
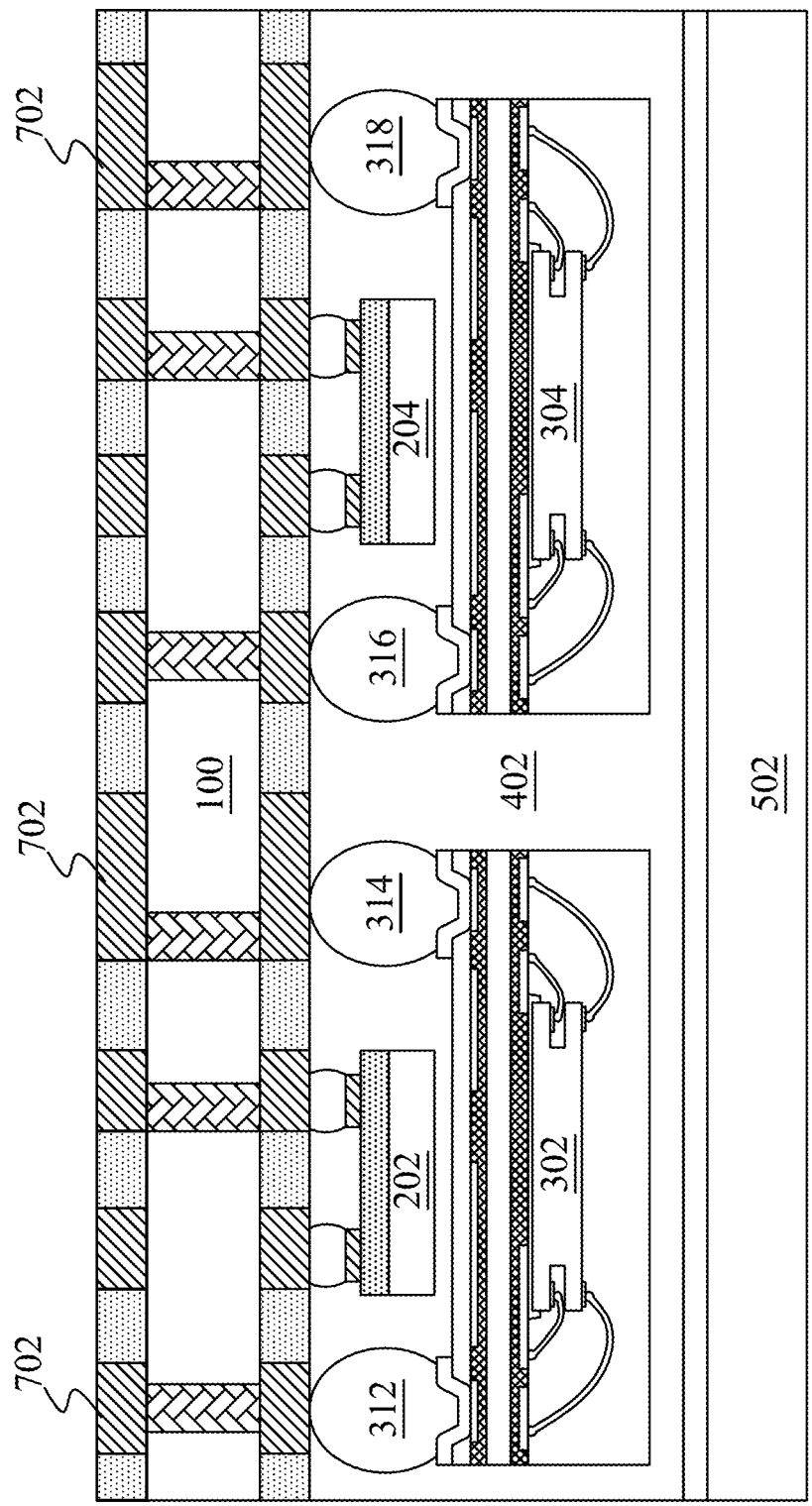
Figure 20:
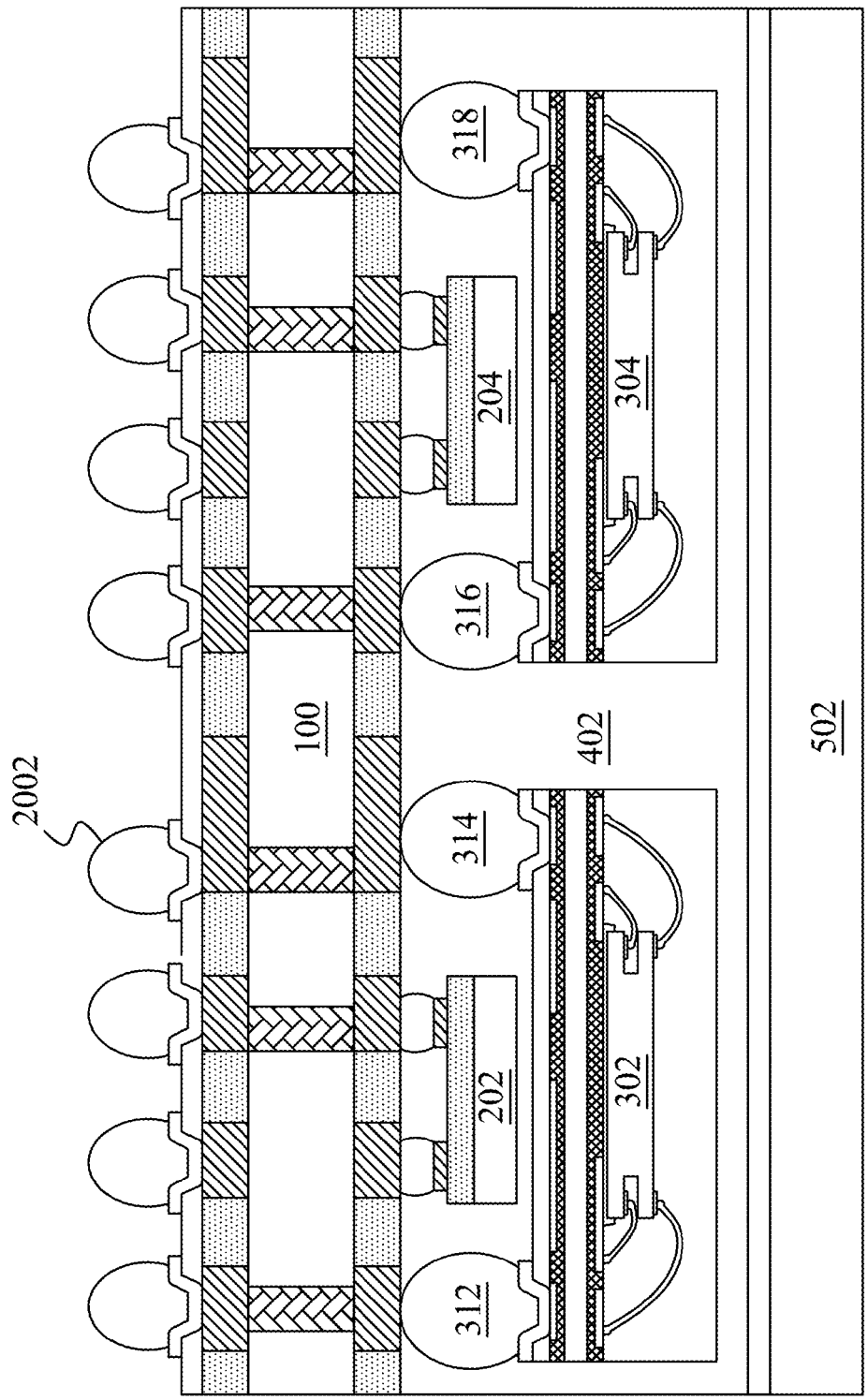
Figure 21:
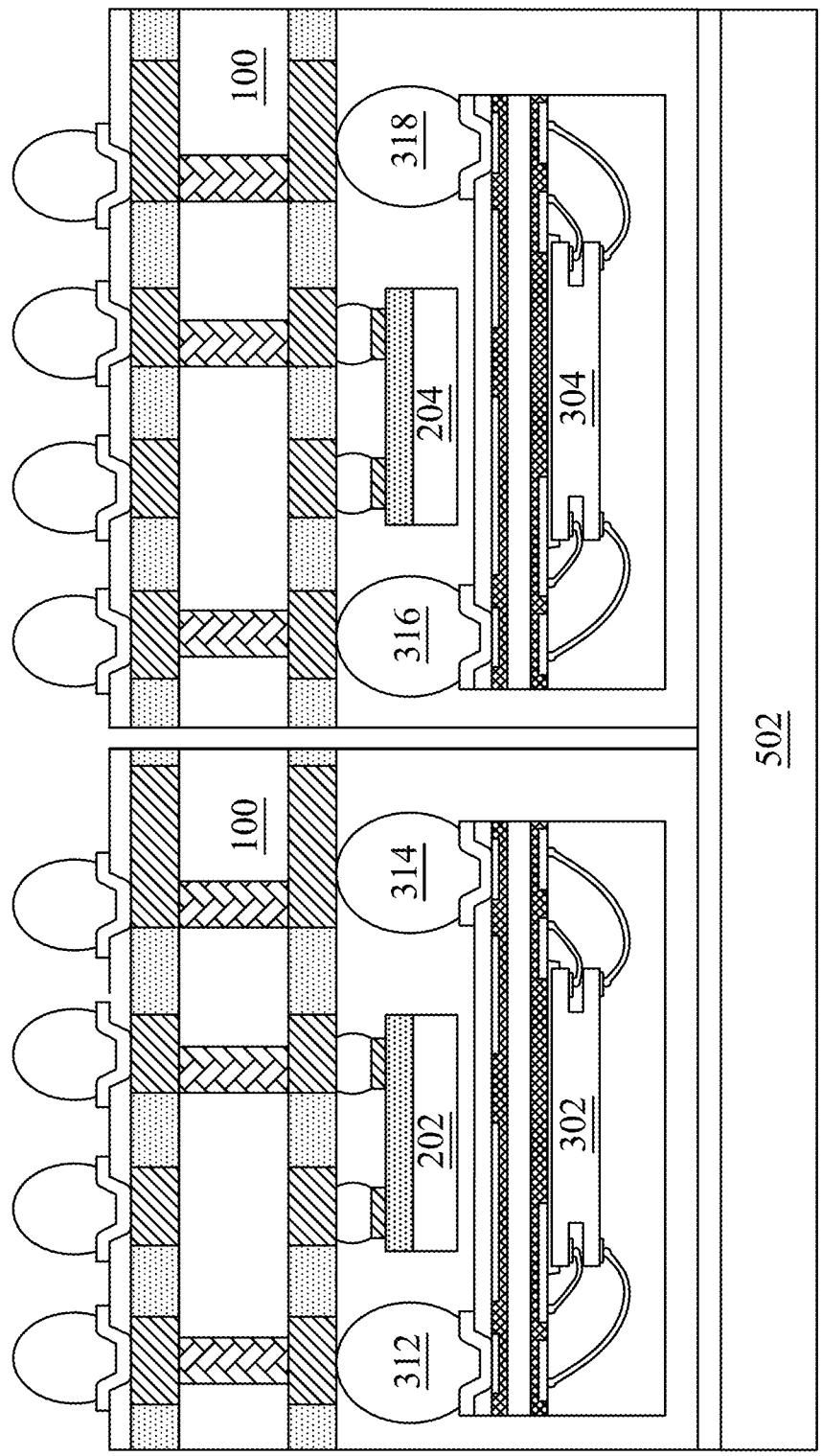
Figure 22:
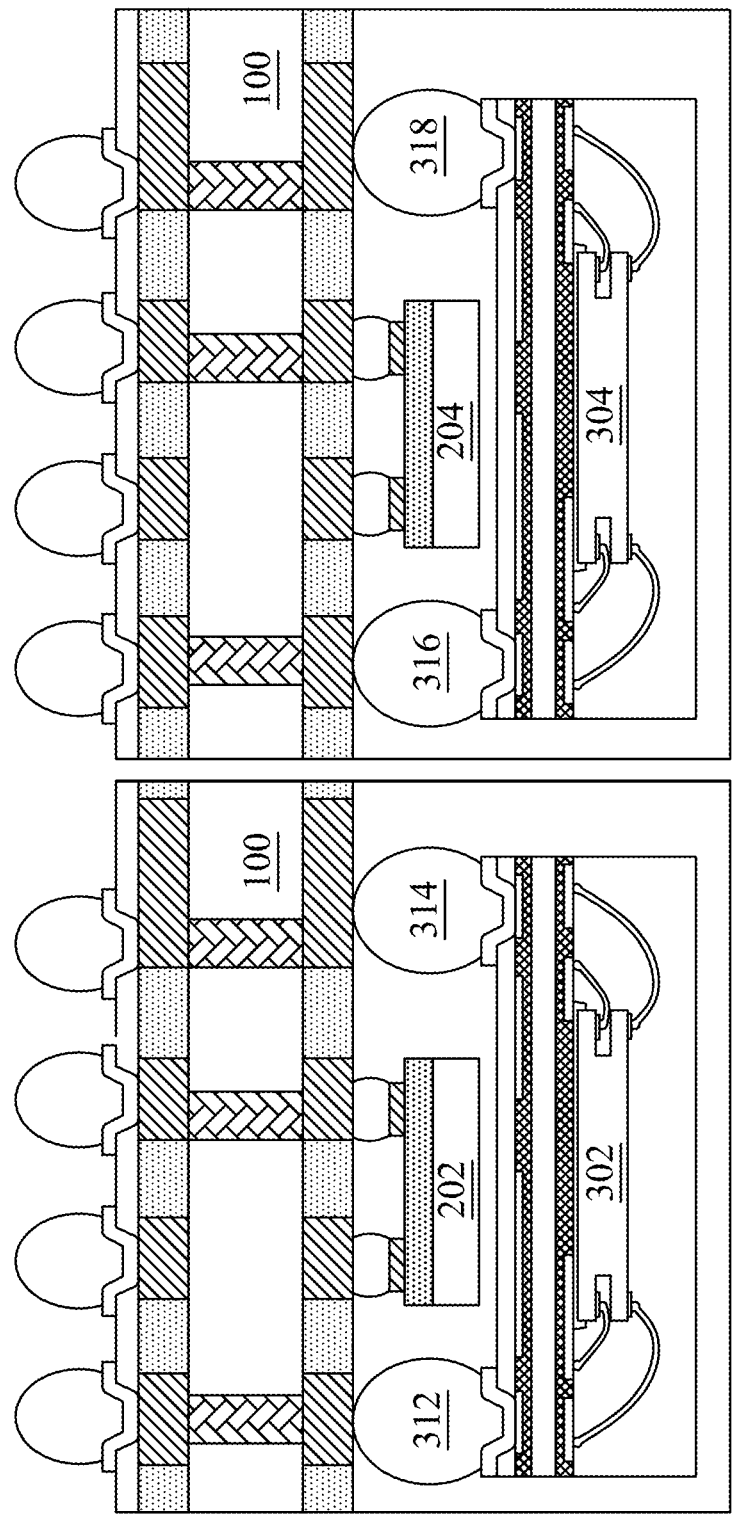
Figure 23:
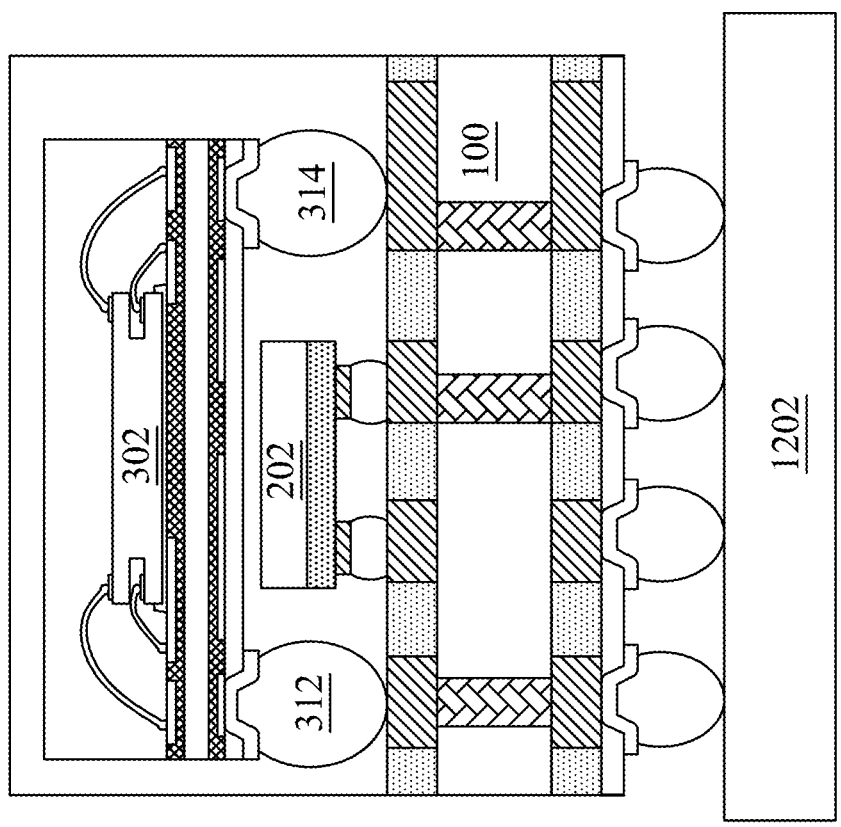

FIG. 12 illustrates a cross sectional view of the semiconductor device shown in FIG. 11 after an individual chip package is mounted on a substrate in accordance with various embodiments of the present disclosure. The chip package may be bonded on a substrate 1202 through another reflow process. Subsequently, a second underfill material layer (not shown) may be formed between the wafer 100 and the substrate 1202. The formation of the underfill material layer is similar to that of the underfill material layer described above with respect to 4, and hence is not discussed in further detail herein.

FIGS. 13-23 are cross sectional views of intermediate stages in the making of a package on package semiconductor device in accordance with another embodiment. The initial steps of this embodiment shown in FIGS. 13-19 are the same the fabrication steps shown in FIGS. 1-7, and hence are not discussed herein again to avoid repetition.

FIGS. 20-23 are similar to FIGS. 8-12 except that the solder balls 2002 are formed over the backside of the wafer 100 before a dicing process is applied to the semiconductor device. The dicing process shown in FIG. 21, the detaching process shown in FIG. 22 and the bonding process shown in FIG. 23 have been described above with respect to FIGS. 10-12, and hence are not discuss again to avoid repetition.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   attaching a semiconductor die on a first side of a wafer comprising a plurality of embedded vias;
   attaching a first top package on the first side of the wafer, wherein the semiconductor die has a leftmost edge and a rightmost edge, and wherein both the leftmost edge and the rightmost edge are located within a range from a left edge of the first top package to a right edge of the first top package, and wherein the first top package is connected to the first side of the wafer through at least one bump and a bottom surface of the at least one bump is in direct contact with a first redistribution layer on the first side of the wafer;
   attaching a second top package on the first side of the wafer;
   depositing an encapsulation layer over the first side of the wafer, wherein the first top package and the second top package are embedded in the encapsulation layer;
   applying a thinning process to a second side of the wafer until embedded ends of the embedded vias are exposed, wherein after the step of applying the thinning process, a thickness of the wafer is less than 20 um;
   after the step of applying the thinning process to the second side of the wafer, forming a redistribution line over the second side of the wafer, wherein the redistribution line is in direct contact with a via of the wafer, and edges of the redistribution line extend beyond corresponding edges of the via;
   attaching a dicing tape on the second side of the wafer, wherein the redistribution line is in direct contact with the dicing tape;
   applying a sawing process to the wafer until a portion of the dicing tape has been removed during the sawing process, wherein after the step of applying the sawing process to the wafer, the wafer is divided into a plurality of chip packages; and
   attaching one of the plurality of chip packages to a substrate.

2. The method of claim 1, further comprising:
   after the step of forming the redistribution line over the second side of the wafer, forming a plurality of bumps over the second side of the wafer.

3. The method of claim 1, further comprising:
   after the step of applying the sawing process to the wafer, forming a plurality of bumps over the second side of the wafer.

4. The method of claim 1, further comprising:
   forming a first underfill layer between the wafer and the semiconductor die.

5. The method of claim 1, wherein:
   the embedded vias are coupled to the first redistribution layer.

6. A method comprising:
   attaching a first semiconductor die on a first side of a wafer;
   attaching a second semiconductor die on the first side of the wafer;
   attaching a first top package on the first side of the wafer, wherein the first semiconductor die has a leftmost edge and a rightmost edge, and wherein both the leftmost edge and the rightmost edge are located within a range from a left edge of the first top package to a right edge of the first top package, and wherein the first top package is connected to the first side of the wafer through at least one bump and a bottom surface of the at least one bump is in direct contact with a first redistribution layer on the first side of the wafer;
   attaching a second top package on the first side of the wafer, wherein the second semiconductor die has a leftmost edge and a rightmost edge, and wherein both the leftmost edge and the rightmost edge are located within a range from a left edge of the second top package to a right edge of the second top package;
   depositing an encapsulation layer over the first side of the wafer to form a package, wherein the first semiconductor die, the second semiconductor die, the first top package and the second top package are embedded in the encapsulation layer;
   attaching the package on a carrier through a release layer, wherein a surface of the encapsulation layer is in direct contact with the release layer;
   applying a thinning process to a second side of the wafer;
   after the step of applying the thinning process to the second side of the wafer, depositing a dielectric layer on the second side of the wafer;
   forming a redistribution line in the dielectric layer, wherein the redistribution line is in direct contact with a via of the wafer, and wherein a first edge of the redistribution line is vertically aligned with a first edge of the via and a second edge of the redistribution line extends beyond a second edge of the via;
   sawing the wafer into a plurality of chip packages; and
   attaching one of the plurality of chip package to a substrate.

7. The method of claim 6, further comprising:
   forming a first underfill layer between the wafer and the first semiconductor die; and
   forming a second underfill layer between the wafer and the second semiconductor die.

8. The method of claim 6, further comprising:
   forming a third underfill layer between the wafer and the substrate.

9. The method of claim 6, further comprising:
   detaching the carrier from the wafer before the step of sawing the wafer into the plurality of chip packages; and
   forming a plurality of bumps over the second side of the wafer.

10. The method of claim 6, further comprising:
    attaching the wafer to the carrier;
    applying the thinning process to the second side of the wafer;
    forming the redistribution line over the second side of the wafer; and
    forming a plurality of bumps over the second side of the wafer.

11. The method of claim 10, further comprising:
    detaching the carrier from the wafer after the step of sawing the wafer into the plurality of chip packages.

12. A method comprising:
    attaching a semiconductor die on a first side of a wafer comprising a plurality of embedded vias, wherein the semiconductor die is connected to the first side of the wafer through a first bump, and wherein a bottom surface of the first bump is in direct contact with a first distribution layer on the first side of the wafer;

attaching a first top package on the first side of the wafer, wherein the semiconductor die has a leftmost edge and a rightmost edge, and wherein both the leftmost edge and the rightmost edge are located within a range from a left edge of the first top package to a right edge of the first top package, and wherein the first top package is connected to the first side of the wafer through a second bump and a bottom surface of the second bump is in direct contact with a second redistribution layer on the first side of the wafer;

attaching a second top package on the first side of the wafer;

depositing an encapsulation layer over the first side of the wafer to form a package, wherein the first top package and the second top package are embedded in the encapsulation layer;

attaching the package on a carrier through a release layer, wherein a surface of the encapsulation layer is in direct contact with the release layer;

applying a thinning process to a second side of the wafer until embedded ends of the embedded vias are exposed, wherein after the step of applying the thinning process, a thickness of the wafer is less than 20 um;

after the step of applying the thinning process to the second side of the wafer, depositing a dielectric layer on the second side of the wafer;

forming a redistribution line in the dielectric layer, wherein the redistribution line is in direct contact with a via of the wafer, and wherein a first edge of the redistribution line is vertically aligned with a first edge of the via and a second edge of the redistribution line extends beyond a second edge of the via;

forming a plurality of bumps over the dielectric layer;

after the step of forming the plurality of bumps, separating the wafer into a plurality of chip packages by applying a sawing process to the wafer until a top surface of the release layer is exposed; and attaching one of the plurality of chip packages to a substrate.

* * * * *